United States Patent
Jun

(10) Patent No.: US 6,178,390 B1
(45) Date of Patent: Jan. 23, 2001

(54) METHOD FOR CONTROLLING THICKNESSES OF LAYERS FORMED BY DEPOSITION EQUIPMENT FOR FABRICATING SEMICONDUCTOR DEVICES

(75) Inventor: Yong-min Jun, Kyonggi-do (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/148,865

(22) Filed: Sep. 8, 1998

(30) Foreign Application Priority Data

Dec. 26, 1997 (KR) .................................................. 97-74014

(51) Int. Cl.⁷ ........................................................ H01L 21/70
(52) U.S. Cl. ........................ 702/170; 702/127; 700/108; 700/121; 438/16; 438/18
(58) Field of Search ..................................... 700/109, 108, 700/121; 430/270.17, 270.13, 270.11, 945; 369/121, 109, 288, 25.1; 428/64.5, 64.6; 702/170, 127, 56; 438/16, 18; 73/658; 324/754, 765

(56) References Cited

U.S. PATENT DOCUMENTS 5,444,637 * 8/1995 Smesny et al. ........................ 702/56

FOREIGN PATENT DOCUMENTS

11354453 * 12/1999 (JP) ............................. H01L/21/203

OTHER PUBLICATIONS

"Semiconductor Mask, the Structure and its Fabrication Method"; IBM Technical Disclosure Bulletin; vol. 37, issue 12, pp. 141–142; Dec. 1994.*

* cited by examiner

Primary Examiner—Kamini Shah
(74) Attorney, Agent, or Firm—Jones Volentine, LLC

(57) ABSTRACT

A method for controlling thicknesses of layers formed by a deposition apparatus for semiconductor device fabrication includes retrieving a latest process record for a latest batch from a process database for a deposition apparatus. Each process record in the database describes one layer deposition process using the deposition apparatus operating on one batch. A batch includes a plurality of lots, each lot having a workpiece. The method further includes receiving a latest array of thicknesses, each thickness from one lot of the latest batch. Then an automatic corrected setting is calculated. If the automatic corrected setting is within a specification setting range, the specification is met and the method continues. A next batch signal is input if the layer deposition process may proceed on a next batch, and the automatic corrected setting is displayed. A predetermined correction command is input to indicate a predetermined corrected setting is to be used instead of the automatic corrected setting. The automatic corrected setting is downloaded to the deposition apparatus when the predetermined correction command has not been input.

21 Claims, 7 Drawing Sheets

METHOD FOR CONTROLLING THICKNESSES OF LAYERS FORMED BY DEPOSITION EQUIPMENT FOR FABRICATING SEMICONDUCTOR DEVICES

BACKGROUND OF THE INVENTION

1. Field of the Invention

The present invention relates to a method for controlling thicknesses of layers formed by a depositing apparatus for fabricating semiconductor devices. More particularly, the present invention relates to a method for controlling thicknesses of layers based on rapid and accurate analyses of measured data using an operation module included in a host computer.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line. The processing line frequently includes a deposition apparatus for depositing a desired substance in a layer with a desired thickness on a semiconductor substrate.

As shown in FIG. 1, a conventional deposition apparatus 3 is disposed on a conventional processing line. When a lot 10 of workpieces, such as wafers, are introduced into the deposition equipment 3, the deposition equipment 3 performs a deposition process on the lot 10. The deposition equipment 3 is connected on-line to a host computer 1 through a deposition equipment server 5. An operator interface (O/I) 2, for example an operator interface personal computer (O/I PC), is also connected on-line to the host computer 1. An appropriate process setting, for example, a desired deposition time duration or a desired deposition temperature, is entered into the host computer 1 by the operator through the O/I 2. The operator selects the process setting to give a desired layer thickness. The process setting is rapidly downloaded into the deposition equipment 3 from the host computer 1 through the deposition equipment server 5. Then the deposition equipment 3 performs based on the process settings received and deposits the given substance in a layer of a certain thickness on the workpieces of each lot 10.

At the end of the deposition process, the lot 10 of workpieces with the deposited layer is introduced into the measuring equipment 4. The thickness of the actually deposited layer is measured by the measuring equipment 4 for each lot. The measured thicknesses constitute thickness data that are rapidly uploaded to the host computer 1 through the measuring equipment server 6, and are then transferred to the O/I 2 by the host computer 1, and displayed at the O/I 2. The operator can monitor the displayed thickness measurements and reset the process settings presently used by the deposition apparatus 3 to obtain more desirable values of thickness.

The deposition process is carried out in such a manner that a plurality of lots 10, for example, six lots, are grouped as a batch for the deposition apparatus 3. In an exemplary deposition process, a layer, such as a metal layer or an oxidation layer for a semiconductor device, are deposited on the lots. FIG. 2 is a schematic cross sectional view of a conventional deposition apparatus and shows a boat 101 which holds several lots introduced into the deposition apparatus 3, each lot at a different position in the boat 101.

For example, A indicates a central position in the deposition apparatus 3, B indicates an upper position in the deposition apparatus 3, and C indicates a lower position in the apparatus 3. Typically, the temperatures in the upper and lower positions B and C in the deposition equipment 3 have lower temperatures than the central position A because of the effect of external air. As a result, the thicknesses of the deposited layers vary according to the position of the lot within the deposition equipment 3. FIG. 3 is a graph showing the variation of thicknesses of layers formed on lots 10 in a conventional deposition apparatus 3 versus positions of the lots within the apparatus 3.

The thicknesses of the deposited layers also vary from batch to batch. FIG. 4 is a graph of thicknesses of layers formed in lots by a conventional deposition equipment versus batch units of the lots. The deposition process is performed on a batch unit after a deposition time duration is set by the operator. As the deposition time settings are varied for the different batches, the average thickness of the deposited layers also varies. The distribution of the average thickness of the deposited layers on the lots in the batch according to the batch number is shown in FIG. 4.

Based on his experiences, the operator analyzes the measured thickness data displayed at the O/I 2 immediately after each batch is processed in the deposition equipment 3 to determine whether the deposition process has been performed properly, i.e., within design specification. Thereafter, based on the analyzed result, the operator may reset one or more of the apparatus settings, such as the deposition time or the deposition temperature, to more appropriate values to minimize the deviations from the design specification for layer thicknesses. Typically, the operator controls the differences in the average thicknesses of the respective batches by resetting the deposition time, and controls the differences in the thicknesses according to lot positions within the apparatus by resetting the deposition temperature.

However, such a conventional method for controlling thicknesses of layers deposited by the deposition equipment 3 suffers from several problems. First, the results of the analysis of the measured data depends primarily on a human operator's attention and understanding, which takes time and is not perfect. That is, human operator analysis has a finite error rate. Consequently, in the event that any error occurs, even accidentally, the result may be a serious failure of the process.

Secondly, the results of the analysis of the measured data and the corrective settings determined thereby are variable according to which operator analyzes the data. That is, human operator analysis is subjective, not objective. As a result, the data analyses lacks consistency and production control of the products from the processing line may become difficult.

Thirdly, it is very difficult for an inexperienced operator to analyze the measured data. Accordingly, the analysis tasks may be concentrated on skilled operators. This may result in relatively costly analyses.

Finally, a human operator can only function at a finite speed, so the analysis time can not be substantially reduced from current analysis times. This can limit the productivity of the processing line.

SUMMARY OF THE INVENTION

It is therefore an object of the present invention to provide a method for controlling thicknesses of layers deposited by a deposition apparatus for fabricating semiconductor devices which allows more rapid and more accurate analysis of measured data and determination of corrective settings than can be achieved by a human operator by using a computer.

It is another object of the present invention to provide such a method which is capable of achieving consistency in determining corrective settings by establishing an objective analysis procedure.

It is another object of the present invention to provide such a method which is capable of reducing the work load of experienced operators by automating the analysis using a host computer.

To achieve the above objects and other objects and advantages of the present invention, a method for controlling thicknesses of layers formed by a deposition apparatus for semiconductor device fabrication includes retrieving a latest process record for a latest batch from a process database. The database includes a plurality of process records, each process record describing one layer deposition process using the deposition apparatus operating on one batch. The batch includes a plurality of lots, and each lot has a workpiece. The method includes receiving a latest array of thicknesses each derived from a measurement of a measured workpiece of each lot of the latest batch. An automatic setting group including an automatic corrected setting is calculated automatically based on the latest array of thicknesses and the latest process record. By checking whether the automatic corrected setting is within a specification setting range it is determined whether a specification has been met. If the specification has been met, it is next determined whether a next batch signal has been input, indicating the layer deposition process may proceed on a next batch. If the next batch signal has been input, the automatic setting group is displayed at an operator interface. A predetermined correction command is input to indicate a predetermined corrected setting is to be used instead of the automatic corrected setting. If the predetermined correction command is not input, the automatic corrected setting is downloaded to the deposition apparatus. The deposition apparatus then performs the layer deposition process on the next batch using the automatic corrected setting.

Accordingly, the present invention makes it possible to automatically analyze the measured data without any intervention of the operator and to apply corrective settings with minimal input by the operator.

BRIEF DESCRIPTION OF THE DRAWINGS

The present invention will be described in detail with reference to the accompanying drawings, in which.

DETAILED DESCRIPTION OF THE PREFERRED EMBODIMENTS

The present invention now will be described with reference to the accompanying drawings, in which preferred embodiments of the invention are shown. This invention may, however, be embodied in many different forms and should not be construed as limited to the embodiments set forth herein.

Figure 5:
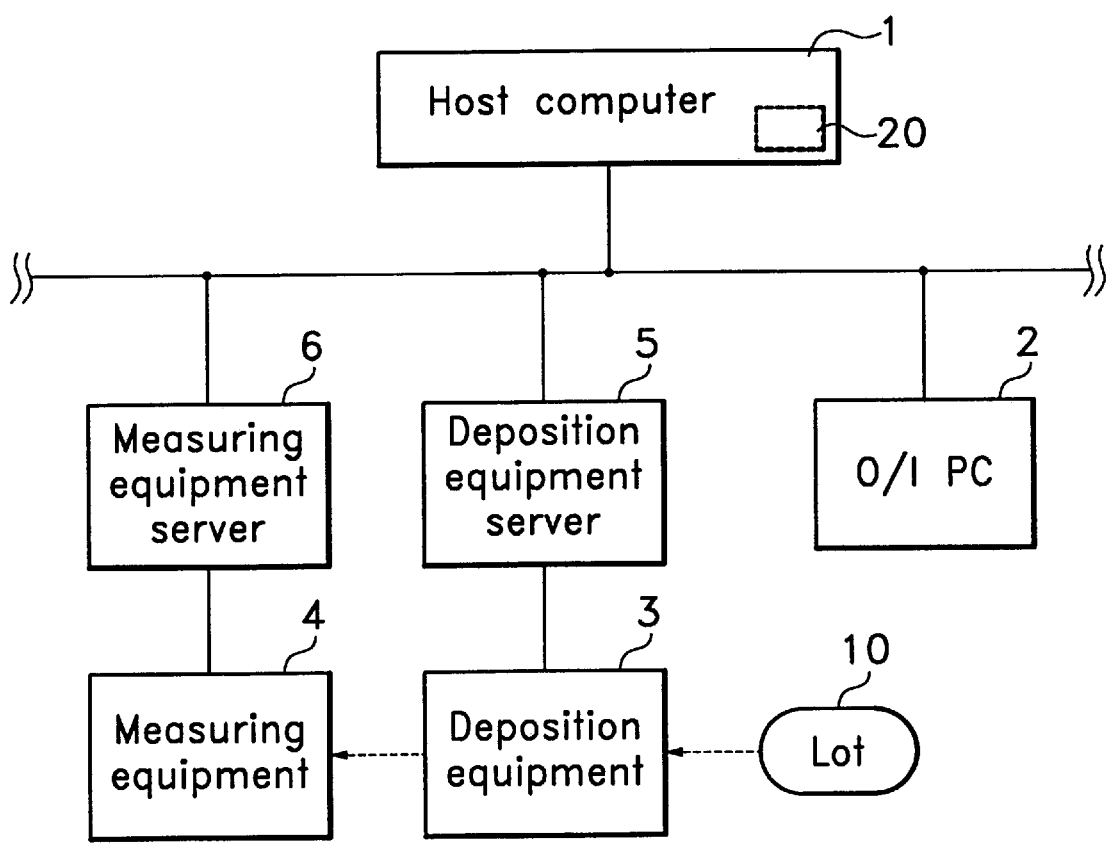
FIG. 5 is a schematic block diagram of the processing line arrangement with a deposition apparatus according to the present invention.

As shown in FIG. 5, according to one embodiment of the present invention, the host computer 1 includes an operation module 20 which automatically analyzes measured data uploaded from measuring equipment 4 through a measuring equipment server 6 and automatically provides corrective settings for controlling the deposition equipment 5. Accordingly, the measured data are rapidly computed and processed by the operation module 20 with speeds and accuracies many times better than achievable by a human operator.

An automatic setting group of automatic corrected settings are calculated through the computation and process by the operation module 20. The automatic corrected settings are downloaded into the deposition equipment 3 by the host computer 1 through the deposition equipment server 5 to reset some or all of the process settings of the deposition equipment 3 as appropriate. According to the process settings, the deposition equipment 3 performs the deposition processes on a subsequently introduced, i.e., next, batch of lots. As a result of desirable resetting of some process settings, more uniform thicknesses for the deposited layers can be obtained in the next lots.

Figure 6:
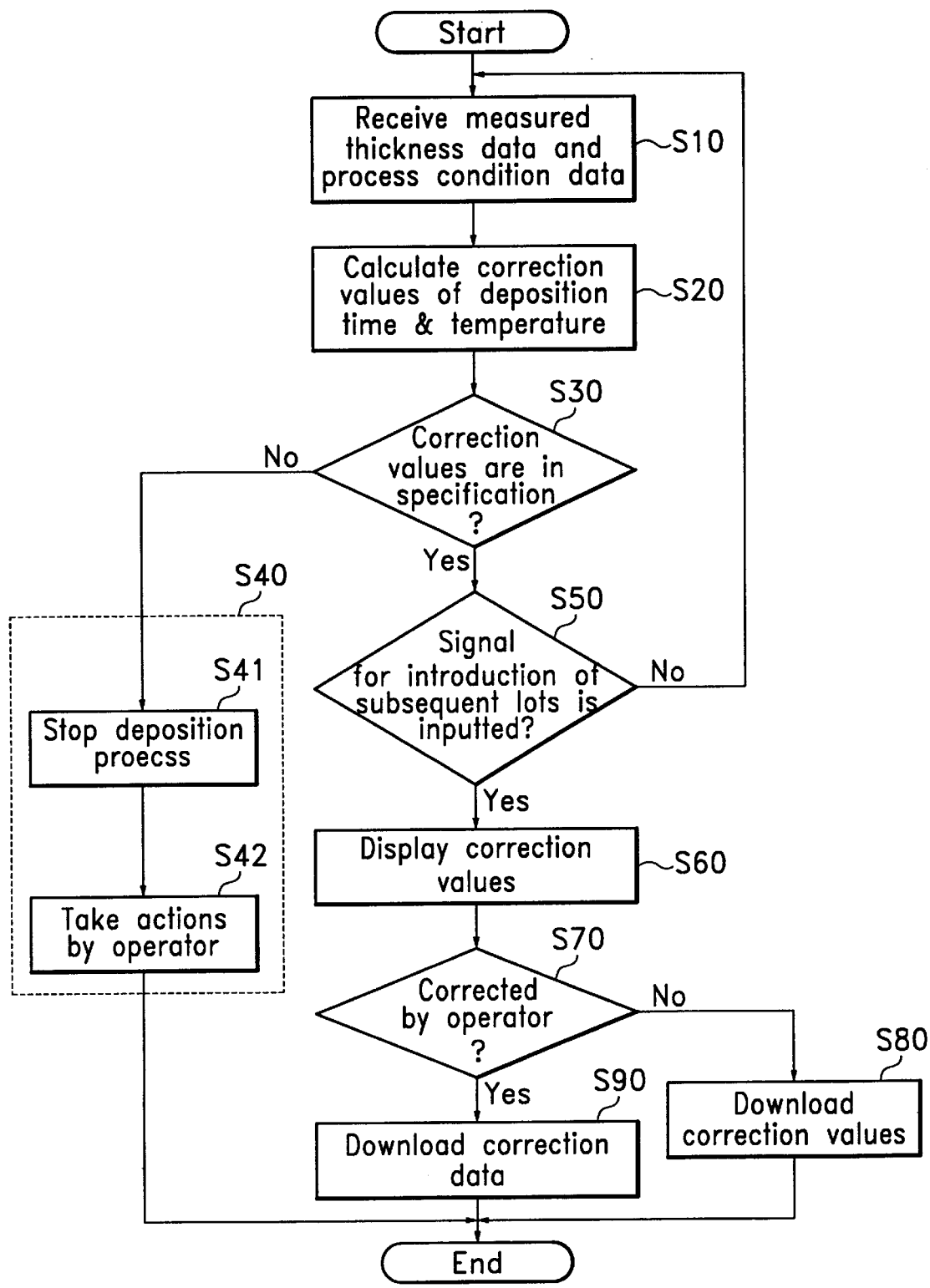
FIG. 6 is a flowchart of a method for controlling thicknesses of layers deposited according to the present invention.

As shown in FIG. 6, the method for controlling thicknesses of layers formed by deposition equipment according to one embodiment of the present invention can be described briefly as follows. The method includes receiving thickness data obtained by measuring thicknesses of layers on workpieces from the most recent, i.e., latest, lots of the latest batch S10. The thickness data is arranged in an array of thickness for the latest batch. This step includes retrieving process condition data and process settings applicable for the deposition process S10 for the latest batch. The method then includes calculating automatically the correction values for the most recently applied process settings such as the deposition time and the deposition temperature S20; i.e., calculating automatic corrected settings. This calculation is based on the measured thickness data and the process condition data. The next step is determining whether the correction values are in a specification or not (S30), i.e., whether the automatic corrected settings are within respective specification setting ranges. If the correction values are not within the specification, the method calls for stopping the deposition process and taking predetermined actions by an operator (S40). If the correction values are within the specification, the method calls for determining whether a signal for introducing the subsequent lots, i.e., the next batch, has been entered at the O/I (S50). If the signal to process the next batch has been input, the method calls for displaying the correction values, i.e., the automatic corrected settings at the O/I (S60). After displaying the automatic corrected settings, the method determines whether a predetermined correction command has been entered at the O/I by the operator or not (S70), indicating that one or more of some predetermined corrected settings is or are to be used instead of one or more of the automatic corrected settings. If the command is not entered, the method calls for downloading the correction values into the deposition equipment (S80). If the command is entered, the method calls for receiving predetermined correction data, i.e., predetermined corrected settings, from the correction command and downloading the received predetermined correction data into the deposition equipment (S90). These steps of the method as shown in FIG. 6 will be described more in detail hereinafter.

Referring to FIG. 5 and FIG. 6, the thicknesses of layers in the latest batch are measured by the measuring equipment 4. The measured thickness data in a latest array of thicknesses are uploaded into the host computer 1 through the measuring equipment server 6. In the preferred embodiment, the uploaded thickness data are saved into the latest process record of the process database in the host computer 1. Thereafter, data describing the process settings and actual process conditions applied to the latest batch are read from the latest process record of the database by the host computer 1. Then, the measured thickness data and the process data from the latest process record are transmitted to the operation module 20. The transmitted measured thickness data and process data are rapidly received and read by the operation module 20. (S10).

Figure 7:
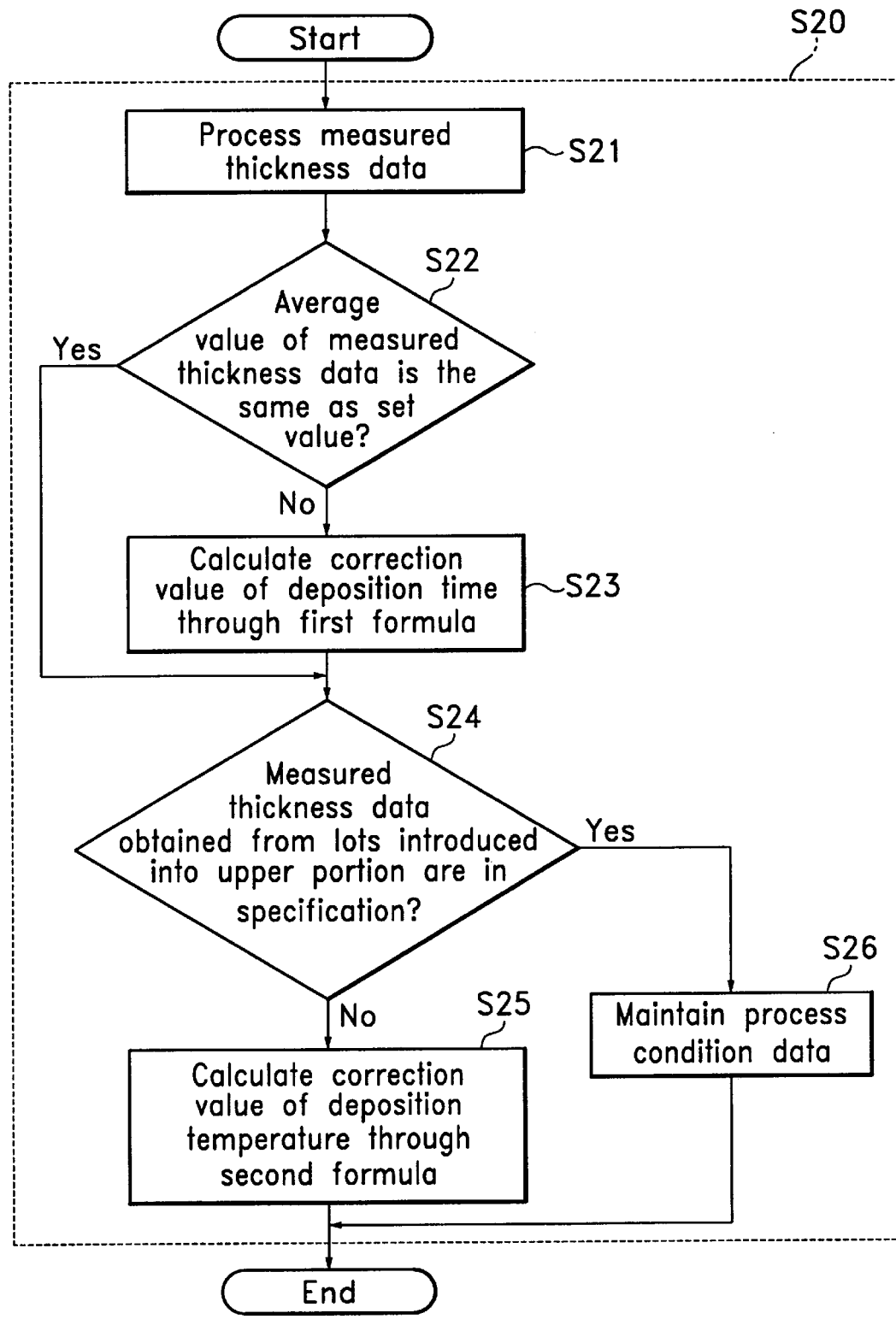
FIG. 7 is a detailed flowchart of the second step S20 of FIG. 6.

Referring to FIG. 5 and FIG. 7, the step of automatically calculating the automatic corrected settings (S20) in the preferred embodiment is described. In the preferred embodiment, one of the automatic corrected settings in an automatic setting group is the automatic corrected deposition time and another is an automatic corrected deposition temperature. In the preferred embodiment, step S20 includes processing the measured thickness data (S21) to derive a latest average batch thickness and determining whether this latest average batch thickness is the same as a set target thickness value or not (S22). If the latest average batch thickness is not the same as the target thickness, the method calls for calculating a correction value of the presently applied amount of deposition time, i.e., the automatic corrected deposition time, using a time formula (S23) evaluated by the operation module 20. In any case, the method includes determining whether the variation in thicknesses among lots of the latest batch are within a design specification thickness range (S24). This variation among lots is estimated by obtaining the thickness of a test lot at a predetermined test lot position within the deposition apparatus. In the preferred embodiment the test lot position is in an upper position of the deposition apparatus, as indicated by position B in FIG. 2. If the test lot thickness is not within the design specification thickness range, the method calls for calculating a correction value of the deposition temperature, i.e., the automatic corrected deposition temperature, using a temperature formula (S25). If the test lot thickness is within the design specification thickness range, the method calls for maintaining the deposition temperature as used in the latest batch and stored in the latest process record, and saving that deposition temperature in the next process record (S26).

For description purposes, example measured thickness data and process data are defined as given in Table 1. In this example the latest batch to be introduced into the deposition equipment 3 is the third batch of Table 1, and the next batch, i.e., the batch to be subsequently introduced into the deposition equipment 3 after the operation of the operation module 20, is the fourth batch of Table 1. In this example, the predetermined target thickness is 1000 Å, a predetermined reliability weight, $\alpha$, used in a preferred embodiment of the time formula is 0.6, and a predetermined constant deposition speed, DR1, also used in the preferred time formula is 4. Also in this example, the predetermined design specification thickness range is taken to be 1100 Å to 995 Å.

TABLE 1

Measured Thickness Data and Process Data

| | Batch 1 | Batch 2 | Batch 3 | Batch 4 |
|---|---|---|---|---|
| Deposition temperature (Upper position of the deposition equipment) | 620° C. | 625° C. | 630° C. | ? |
| Average batch thickness (Average thickness of layers Central position of the deposition equipment) | 1010Å | 1020Å | 1030Å | ? |
| Test lot thickness (Average thickness of layers Upper position of the deposition equipment) | 970Å | 980Å | 990Å | ? |
| Deposition time duration | 110 sec | 120 sec | 130 sec | ? |

Figure 1:
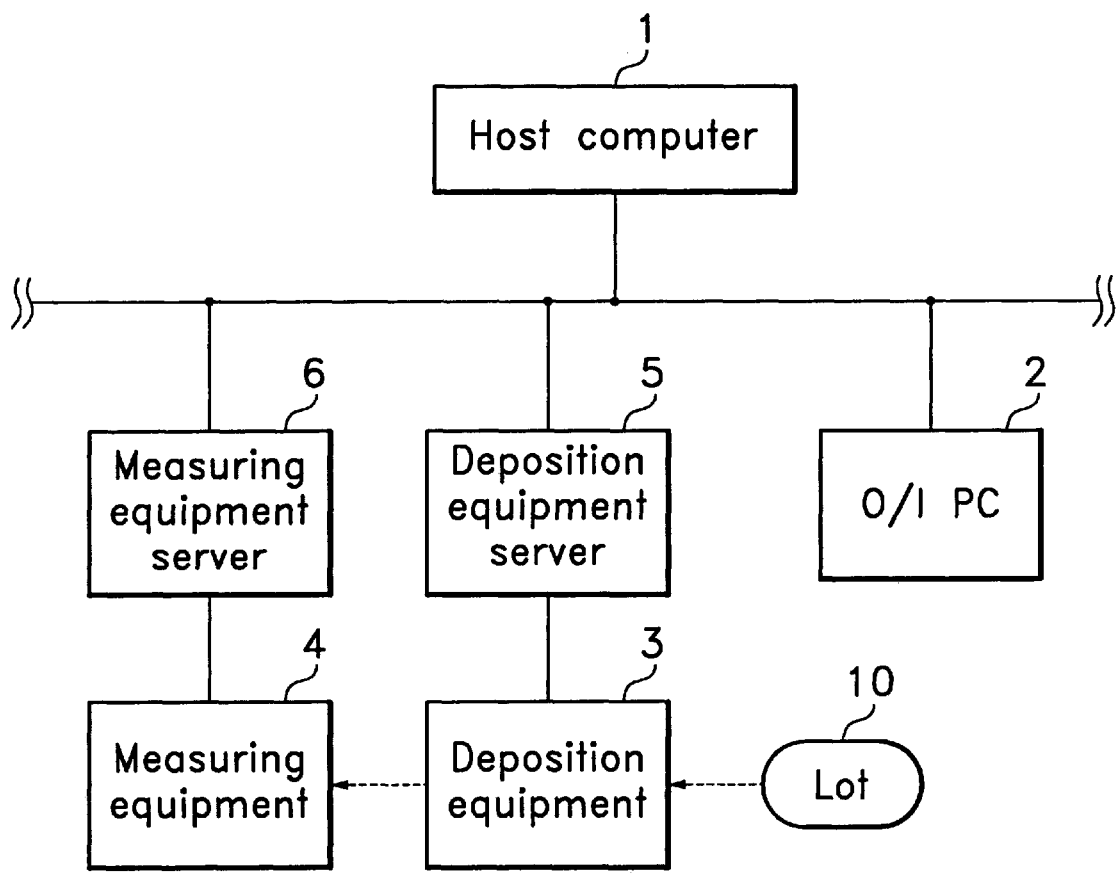
FIG. 1 is a schematic block diagram of the processing line arrangement with a conventional deposition equipment for processing semiconductors.
Figure 2:
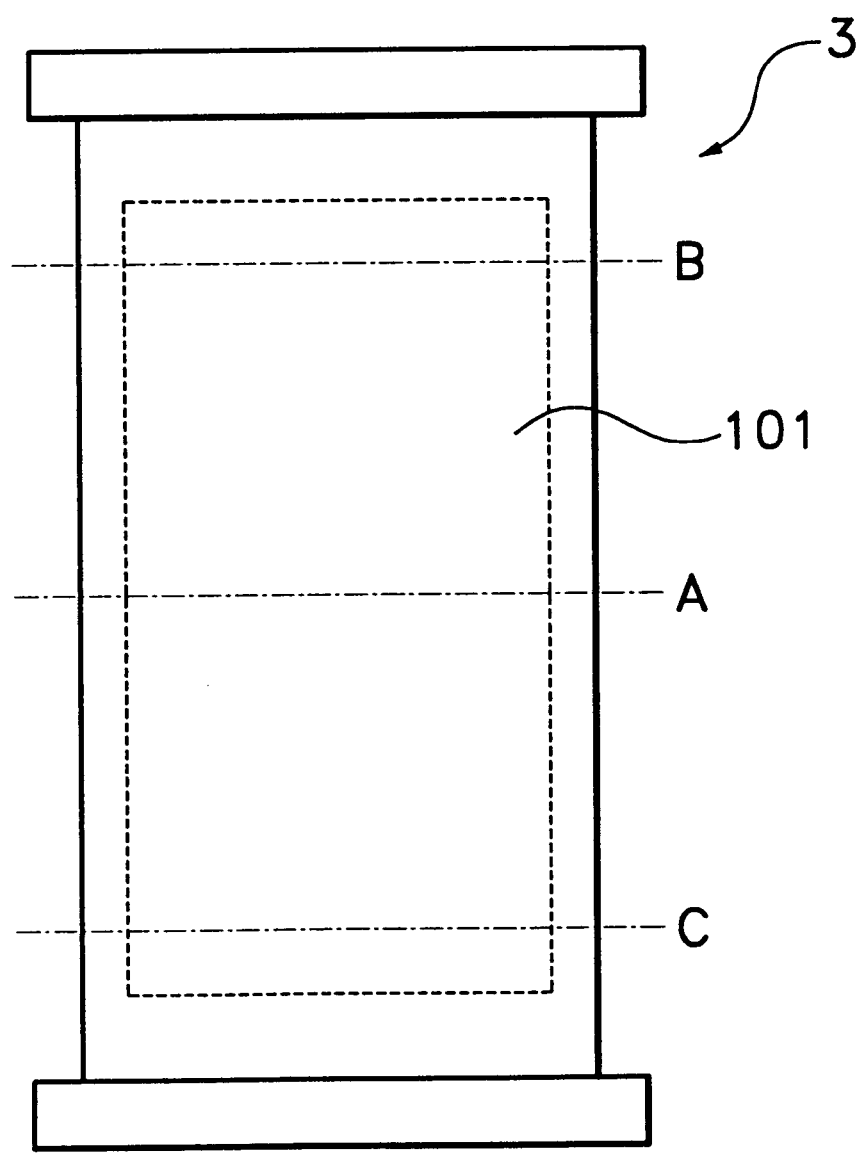
FIG. 2 is a schematic cross sectional view of a conventional deposition apparatus for processing semiconductors.
Figure 3:
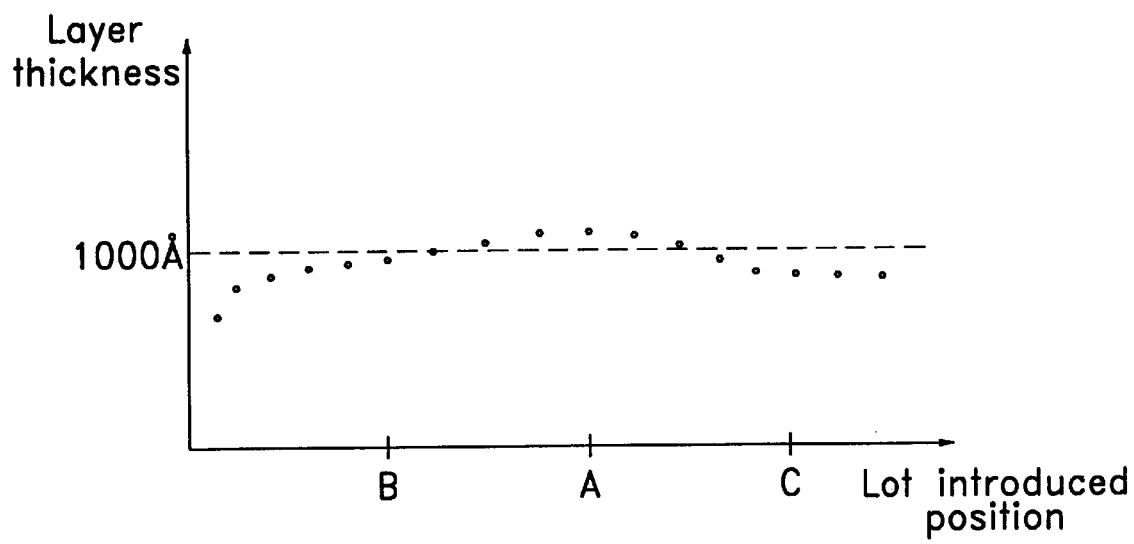
FIG. 3 is a graph of thicknesses of layers deposited on the lots of one batch by a deposition apparatus versus positions of the lots within the deposition apparatus for the conventional controlling method.
Figure 4:
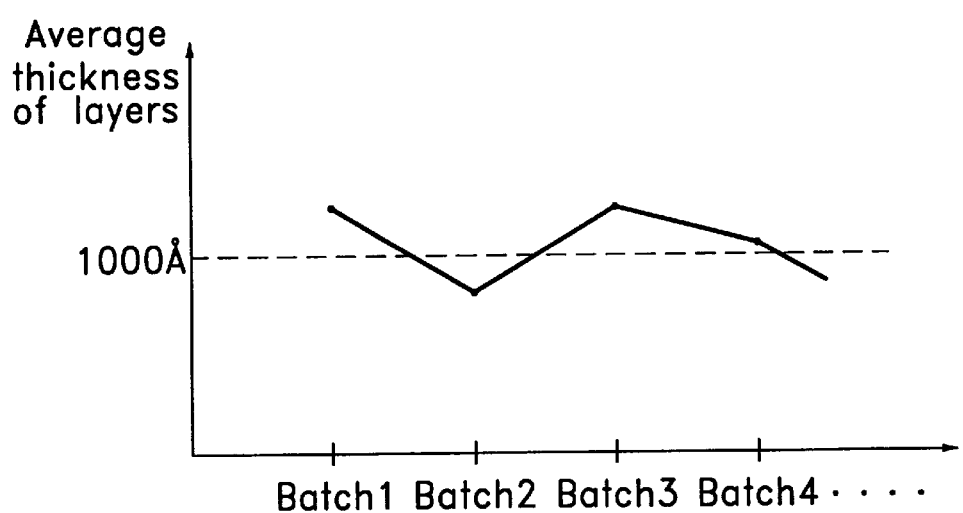
FIG. 4 is a graph of average thicknesses of layers deposited by a deposition apparatus versus batch number for the conventional controlling method.

In this example, during step S21, the average batch thickness is derived by using the measured value of thickness in the latest array of thicknesses associated with the lot taken from a central position of the deposition apparatus 3, i.e., the average batch thickness is equal to the thickness of the workpiece taken from the lot at the position of the apparatus indicated by A in FIG. 2. From Table 1, this value for the average batch thickness is 1030 Å.

In this example, during step S24 this average batch thickness 1030 Å is compared to the target thickness 1000 Å. If they were equal the next step in the method would be step S24. Since they are not equal, an automatic corrected deposition time is calculated through the time formula (S23).

In the preferred embodiment, the time formula is given by $$DT = DT1 \times \alpha + DT2 \times (1-\alpha) \qquad \text{Formula 1}$$

where DT is the automatic corrected deposition time, DT1 is an estimated deposition time based on the actual deposition time applied during the latest batch, DT2 is the actual deposition time applied during the previous batch, i.e., during the batch processed just before the latest batch, and a is the reliability weight for the estimation.

In the preferred embodiment, DT1 is given by $$DT1 = DT3 - \frac{t1 - t2}{DR1} \qquad \text{Formula 2}$$

where DT3 is the actual deposition time applied during the latest batch, t1 is the average batch thickness, t2 is the predetermined target thickness, and DR1 is a predetermined constant deposition speed.

In the example, Formulas 1 and 2 are evaluated based on the values given in Table 1. DT3, the latest deposition time, i.e., the deposition time applied in Batch 3, is 130 sec, and t1, the average batch thickness, i.e., the thickness of layers from the test lot at the central position for Batch 3, is 1030 Å. These values are substituted into Formula 2. In this example, the value for t2, the predetermined target thickness is 1000 Å, and the value for the deposition speed is 4. These values are also substituted into formula 2. As a result, DT1 is calculated as 122.5 sec (because, 130−{(1030−1000)/4}= 122.5).

Thereafter, DT is calculated through Formula 1, as demonstrated with this example. DT2, the previous deposition time, i.e., the deposition time applied in Batch 2, is 120 sec. The above calculated value, 122.5 is substituted for DT1, and 0.6 is substituted for α. When a is 0.6, this means that the estimated time DT1 , 122.5, is 60% reliable. Through Formula 1, the example automatic corrected deposition time DT is calculated as 121.5 sec (because (122.5×0.6)+(120× 0.4)=121.5).

In step S23 of the preferred embodiment, the automatic corrected deposition time DT obtained through the Formulas 1 and 2 is downloaded into the deposition equipment 3, the amount of deposition time presently set in the deposition equipment 3 is reset for the next batch, and the deposition process is then performed on the next batch. In this example the deposition time is reset to 121.5 sec for the next batch, Batch 4.

Figure 8:
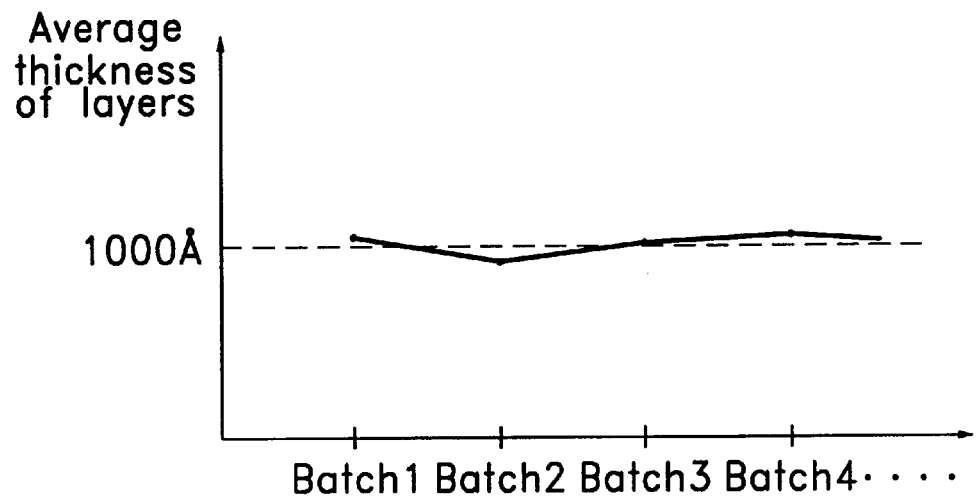
FIG. 8 is a graph of average thicknesses of layers deposited by a deposition apparatus versus batch number according to the present invention.

As a result of the present invention, the distribution of the average thicknesses of the layers deposited by the deposition equipment 3 becomes concentrated about the target value. For example, the average batch thickness becomes concentrated near the target thickness of 1000 Å, as shown in FIG. 8 where average batch thickness is graphed versus batch number.

In step S24 of the preferred embodiment, it is determined whether the variation in thicknesses among lots of the latest batch are within a design specification thickness range. This variation among lots is estimated by obtaining the thickness of a test lot at a predetermined test lot position within the deposition apparatus. In the preferred embodiment the test lot position is in an upper position of the deposition apparatus, as indicated by position B in FIG. 2. In the current example, the predetermined design specification thickness range is taken to be 1100 Å to 995 Å.

If the test lot thickness is within the specification, then the deposition temperature used in the latest batch is appropriate and the same value should be used for the process setting during the next batch. Thus the latest deposition temperature is maintained and saved by the operation module 20 (S26).

If the test lot thickness is not within the specification, then an automatic corrected deposition temperature is calculated through the temperature formula (S25). In the example process, the test lot thickness is given by the average thickness of layers in the upper position of the deposition equipment in Table 1, and the latest test lot thickness, i.e., the test lot thickness of Batch 3, is 990 Å. Since this latest test lot thickness, 990 Å, is not within the predetermined design specification thickness range from 1110 Å to 995 Å, an automatic corrected deposition temperature is calculated using the temperature formula.

In the preferred embodiment, the temperature formula is given by $$DX = DX1 + \Delta DX2 \qquad \text{Formula 3}$$

where DX is the automatic corrected deposition temperature to be used as a setting for the deposition apparatus during the next batch, DX1 is an actual deposition temperature measured at the upper portion of the deposition equipment during the processing of the latest batch, and ΔDX2 is a displacement temperature.

In the preferred embodiment, ΔDX2 is given by $$\Delta DX2 = \Delta t3 / (DR2 + M) \qquad \text{Formula 4}$$

where Δt3 is the difference between the average batch thickness and the latest test lot thickness, DR2 is a cumulative temperature dependence over the several batches in terms of layer deposition thickness per 1° C., and M is an estimated slope of changes in DR2 between successive batches.

In the preferred embodiment, M is given by $$M = \frac{\sum_{i=1,N-1} m(i)}{N} \qquad \text{Formula 5}$$

where i is the batch number, m is a ratio of changes in layer thicknesses to changes in deposition temperatures, measured on test lots in the respective batches, and N is the number of the batches including the latest batch.

Also in the preferred embodiment, DR2 is given by $$DR2 = \Delta t / \Delta x \qquad \text{Formula 6}$$

where Δt is a cumulative sum of changes in the thicknesses of layers measured on the test lots over all the batches, and Δx is a cumulative sum of changes in the deposition temperatures actually applied to all the batches.

In the example, Formulas 3, 4, 5 and 6, are evaluated as follows using the given values with N equal to 3. First, DR2 is calculated by the operation module 20 through Formula 6. The value of Δt is computed from accumulating both the difference between the test lot thicknesses of Batch 1 and Batch 2 as given in Table 1, i.e., the difference between 970 Å and 980 Å which is 10 Å, and also the difference between the test lot thicknesses of Batch 2 and Batch 3, i.e., the difference between 980 Å and 990 Å which is also 10 Å. That is, 20 Å is substituted for Δt. The value of Δx is computed from accumulating both the difference between the deposition temperatures of Batch 1 and Batch 2 as given in Table 1, i.e., the difference between 620° C. and 625° C. which is 5° C., and also the difference between the deposition temperatures of Batch 2 and Batch 3, i.e., the difference between 625° C. and 630° C. which is also 5° C. That is, 10° C. is substituted for Δx. As a result, DR2 is calculated as 2 (because (10+10)/(5+5)=2).

In this example, an estimated slope M is calculated through Formula 5 by the operation module 20 as follows. According to the definition, the first ratio m(1) depends on the changes between Batch 1 and Batch 2, and is calculated using the values in Table 1 as (980−970)/(625−620). The following, and last, ratio m(2) depends on the changes between Batch 2 and Batch 3, and is calculated as (990−980)/(630−625). Accordingly, $$\sum_{i=1,N-1} m(i) = \sum_{i=1,2} m(i) = \frac{980-970}{625-620} + \frac{990-980}{630-625} = \frac{10}{5} + \frac{10}{5} = 4$$

and M is calculated, through Formula 5, as $$M = \frac{\sum_{i=1,N-1} m(i)}{N} = \frac{\sum_{i=1,2} m(i)}{3} = \frac{4}{3} = 1.34$$

Continuing with this example, ΔDX2 is calculated through Formula 4 by the operation module 20. In this example, the difference between the average batch thickness and the test lot thickness is 40 (because 1030−990=40) and is substituted for Δt3. The value for DR2 is 2 obtained from Formula 6. The value for M is 1.34 obtained from the Formula 5. As a result, ΔDX2 is calculated, through Formula 4, using the values within the range defined by applying the plus operation, as $$\Delta DX2 = \frac{\Delta t3}{(DR2 + M)} = \frac{40}{(2 + 1.34)} = 12.0$$

Then, in this example, DX is calculated through Formula 3 by the operation module 20. The value for DX1, the latest actual deposition temperature, is 630 as given in Table 1. The value for ΔDX2 is 12.0 obtained from Formula 4. As a result of calculation through the temperature formula (Formula 3), using the values within the range defined by applying the plus operation, DX is computed as

DX=DX1+ΔDX2=630+12.0=642.0

Therefore, in this example, the automatic corrected deposition temperature, DX, is 642.0° C.

Figure 9:
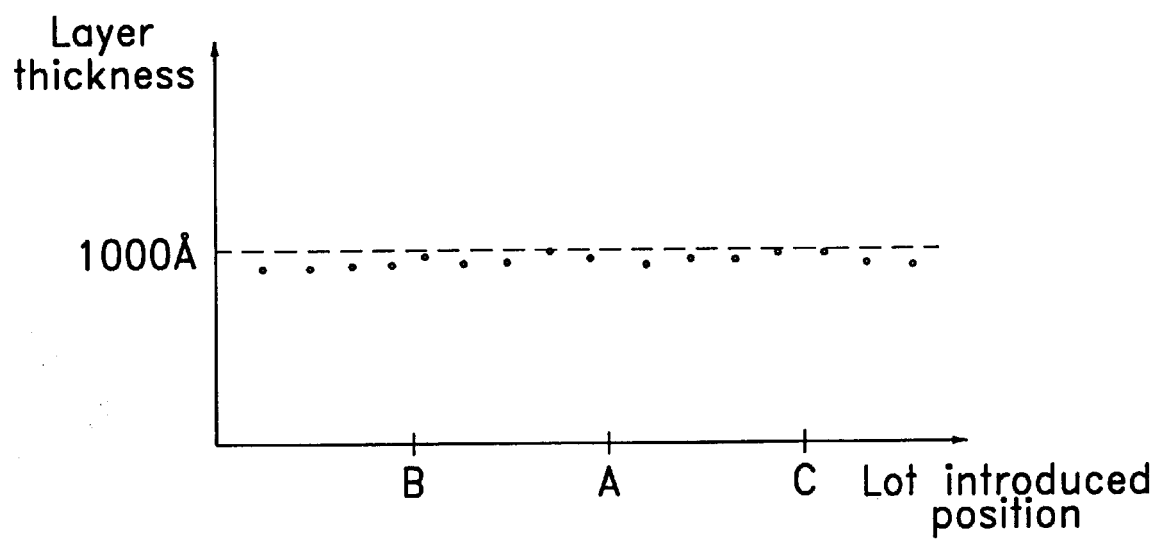
FIG. 9 is a graph of thicknesses of layers deposited on the lots of one batch by a deposition apparatus versus positions of the lots within the deposition apparatus according to the present invention.

When the automatic corrected deposition temperature DX computed by the preferred embodiment of the present invention is downloaded into the deposition equipment 3, the deposition temperature is reset to the automatic corrected deposition temperature for the next batch, and the following deposition process is performed by the deposition equipment 3 on the next batch using the new temperature. As a result of the preferred embodiment of the present invention, the thicknesses of layers formed on lots which are introduced into different positions within the deposition equipment 3 are distributed uniformly and with a concentration along the target thickness. In the example, the deposition temperature to be applied on the next batch is the corrected deposition temperature, 642.0° C., and not the latest deposition temperature 630° C. As a result, in this example, the thicknesses of the lots in the next batch are distributed uniformly and concentrated along the target temperature of 1000 Å as shown in FIG. 9.

In the present invention, the step S20 is followed by step S30, as described with reference to FIG. 5 and FIG. 6. The database includes a specification that gives a specification setting range for each setting. The operation module 20 of the host computer 1 determines whether the automatic corrected setting is within the corresponding specification setting range S30. In the preferred embodiment, the automatic corrected deposition time, if any, and the automatic corrected deposition temperature are checked against the corresponding specification ranges for deposition time and deposition temperature, respectively.

If the automatic corrected settings are not within the corresponding specification setting ranges, the automatic corrected settings calculated by the operation module 20 can not be used. In this case, as part of the preferred embodiment, the host computer 1 controls the process to proceed with step S40 in which the deposition process is stopped S41 and corrective action is taken by the operator S42. For example, step S42 may include displaying a stopping message and the automatically calculated results at the O/I 2 so that the operator can monitor the state of the process and take appropriate actions to solve the problems immediately.

Otherwise, if the automatic corrected settings are within the corresponding specification setting ranges, the host computer 1 determines that the operation module 20 performed the calculation in a manner that the results can be used. In this case, during step S50, the host computer determines whether a next batch signal has been entered at the O/I 2 indicating that the lots of the next batch will be introduced into the deposition apparatus.

If the next batch signal has not been input, the host computer 1 determines that the next deposition process is not yet commenced and so the next process settings are not yet needed. In this case the host computer 1 returns the process to the beginning S10

Otherwise, if the next batch signal has been input, the host computer 1 determines that the next deposition process is commencing. In this case, during step S60 the automatic setting group containing the automatic corrected settings is displayed at the O/I 2. In the preferred embodiment the automatic setting group includes the automatic corrected deposition time, if any, and the automatic corrected deposition temperature. This allow the operator to monitor the automatic corrected settings and decide whether to apply the them to the next batch or not. If the operator decides not to apply any or all of the automatic corrected settings, the operator issues a predetermined correction command that indicates what predetermined correction setting or settings should be used instead of the automatic corrected setting or settings.

At the same time, during step S70, the host computer 1 determines whether the predetermined correction command is input at the O/I by the operator or not.

If it is determined that the predetermined correction command has not been input, the host computer 1 determines during step S80, that the automatic corrected settings, i.e., the correction values, are to be applied to the next batch and downloads them to the deposition equipment 3 through the deposition equipment server 5. In the preferred embodiment, the downloaded automatic corrected settings include the automatic corrected deposition time, if any, and the automatic corrected deposition temperature calculated by the operation module 20. For the example discussed above, the deposition equipment 3 has the deposition time for the next batch reset from the latest value of 130 sec to the corrected value of 121.5 sec, and has the deposition temperature for the next batch reset from the latest value of 630° C. to the corrected value of 642.0° C., which settings are rapidly used by the deposition apparatus 3 during the deposition process on the next batch.

Otherwise, if it is determined that the predetermined correction command has been input, the host computer 1 determines that the automatic correction values, for example, either the automatic corrected deposition time or the automatic corrected deposition temperature or both, calculated by the operation module 20 are not to be applied to the next batch. In this case, during step S90, the host computer receives from the operator and downloads into the deposition equipment 3 predetermined correction values, for example, for the deposition time and the deposition temperature. Then, the deposition equipment 3 resets the presently applied amount of deposition time and deposition temperature as the other correction values by the operator. In the preferred embodiment, for example, the deposition equipment 3 has the deposition time for the next batch reset from the latest value to some predetermined data provided by the operator, or has the deposition temperature for the next batch reset from the latest value to some predetermined data provided by the operator, or both, which settings are rapidly used by the deposition apparatus 3 during the deposition process on the next batch.

As aforementioned, the present invention provides an operation module having a calculating function in a host computer, which is capable of rapidly, accurately, inexpensively and objectively analyzing measured data, and providing batch settings for a subsequent batch that reduces unforeseen failure of a process line.

This invention has been described above with reference to the aforementioned embodiments. It is understood, however, that many alternatives, modifications and variations will be apparent to those having ordinary skill in the art in light of the foregoing description and still are encompassed by the present invention. In particular, the present invention is not limited to the above described deposition equipment and can be applied with useful effect to any semiconductor fabrication equipment disposed on a semiconductor device processing line and requiring predetermined control. Accordingly, the present invention embraces all such alternatives, modifications and variations as fall within the spirit and scope of the appended claims and their equivalents.

What is claimed is:

1. A method for controlling thicknesses of layers formed by a deposition apparatus for semiconductor device fabrication comprising:

retrieving a latest process record for a latest batch from a process database for a deposition apparatus, the database including a plurality of process records, each process record of the plurality of process records describing one layer deposition process using the deposition apparatus operating on one batch, the batch including a plurality of lots, each lot of the plurality of lots including a workpiece;

receiving a latest array of thicknesses, each thickness derived from a measurement of a layer thickness for a measured workpiece of each lot of the plurality of lots of the latest batch;

calculating automatically an automatic setting group including an automatic corrected setting based on the latest array of thicknesses and the latest process record;

determining whether the automatic corrected setting is within a specification setting range;

determining whether a next batch signal has been input, indicating the layer deposition process may proceed on a next batch, when the automatic corrected setting is within the specification setting range;

displaying the automatic setting group at an operator interface when the next batch signal has been input;

determining whether a predetermined correction command has been input in response to said displaying the automatic setting group, the command indicating a predetermined corrected setting is to be used instead of the automatic corrected setting; and downloading the automatic corrected setting to the deposition apparatus when the predetermined correction command has not been input, whereby the deposition apparatus performs the layer deposition process on the next batch using the automatic corrected setting.

2. The method of claim 1, further comprising stopping the deposition process and performing predetermined manual operations when the automatic corrected setting is not within the specification setting range.

3. The method of claim 1, after said downloading the automatic corrected setting, further comprising storing the automatic corrected setting in a next process record for the next batch.

4. The method of claim 1, further comprising downloading the predetermined corrected setting to the deposition apparatus when the predetermined correction command has been input.

5. The method of claim 4, after said downloading the predetermined corrected setting, further comprising storing the predetermined corrected setting in a next process record for the next batch.

6. The method of claim 1, wherein:

during said calculating automatically, the automatic corrected setting is an automatic corrected deposition time and the automatic setting group further includes an automatic corrected deposition temperature.

7. The method of claim 6, said calculating automatically comprising:

deriving an average batch thickness from the latest array of thicknesses;

determining whether the batch thickness is substantially equal to a predetermined target thickness;

computing the automatic corrected deposition time using a time formula when the batch thickness is not substantially equal to the target thickness;

obtaining a latest test lot thickness from the latest array of thicknesses, a test lot thickness corresponding to a test lot which was processed in the deposition apparatus at a predetermined test location;

determining whether the latest test lot thickness is within a specification thickness range; and computing the automatic corrected deposition temperature using a temperature formula, when the latest test lot thickness is not within the specification thickness range.

8. The method of claim 7, said calculating automatically further comprising maintaining the automatic corrected deposition temperature equal to a latest deposition temperature included in the latest process record, when the latest test lot thickness is within the specification thickness range.

9. The method according to claim 7, wherein during said deriving an average batch thickness, the average batch thickness corresponds to a central lot which was processed in the deposition apparatus at a predetermined central location in the latest batch.

10. The method of claim 9, said method further comprising retrieving a previous process record for a previous batch.

11. The method of claim 10, wherein, during said computing the automatic corrected deposition time, the time formula is represented by $$DT = DT1 \times \alpha + DT2 \times (1-\alpha);$$

wherein DT is the automatic corrected deposition time, DT1 is an estimated deposition time, the previous process record includes a previous actual deposition time DT2, and $\alpha$ is a reliability weight.

12. The method of claim 11, wherein, during said computing the automatic corrected deposition time, DT1 is computed from an estimated time formula represented by $$DT1 = DT3 - \frac{t1 - t2}{DR1};$$

wherein, the latest process record includes a latest actual deposition time DT3, t1 is the average batch thickness, t2 is the target thickness, and DR1 is a predetermined constant deposition speed.

13. The method according to claim 9, wherein, during said computing the automatic corrected deposition temperature, the temperature formula is represented by $$DX = DX1 + \Delta DX2;$$

wherein, DX is a range including the automatic corrected deposition temperature, the process record includes an actual deposition temperature applied to the test lot, DX1 is a latest actual deposition temperature of the latest process record, and ΔDX2 is a displacement temperature.

14. The method of claim 13, said method further comprising retrieving a plurality of N−1 previous process records, wherein a plurality of N batches are identified in sequence from an earliest batch to the latest batch.

15. The method according to claim 14, wherein, during said computing the automatic correction deposition temperature, ΔDX2 is a range given by a displacement temperature formula represented by $$\Delta DX2 = \Delta t3/(DR2+M);$$

wherein, Δt3 is a difference between the average batch thickness and the latest test lot thickness, DR2 is a cumulative temperature dependence over the N batches, and M is an estimated slope of changes in DR2 between batches.

16. The method according to claim 15, wherein, during said computing the automatic correction deposition temperature, M is given by a slope formula represented by $$M = \frac{\sum_{i=1,N-1} m(i)}{N};$$

wherein, the process record includes the test lot thickness, m(i) is a ratio of a thickness change between two sequential batches to a temperature change between the two sequential batches, the temperature change being a difference between actual deposition temperatures corresponding to the two sequential batches, and the thickness change being a difference between test lot thicknesses corresponding to the two sequential batches.

17. The method according to claim 16, wherein, during said computing the automatic correction deposition temperature, DR2 is given by a cumulative dependence formula represented by $$DR2 = \Delta t/\Delta x;$$

wherein, Δt is a difference between the latest test lot thickness and the test lot thickness corresponding to the earliest batch; and Δx is a difference between the latest actual deposition temperature and the actual deposition temperature corresponding to the earliest batch.

18. The method of claim 1, after said receiving the latest array, further comprising storing the latest array of thicknesses into the latest process record.

19. The method of claim 3, after said storing the automatic corrected setting, further comprising storing other applied process settings into the next process record.

20. The method of claim 5, after said storing the predetermined corrected setting, further comprising storing other applied process settings into the next process record.

21. A method for controlling a measurable quantity effected by an apparatus for semiconductor device fabrication comprising:

retrieving a latest process record for a latest batch from a process database for a fabrication apparatus, the database including a plurality of process records, each process record of the plurality of process records describing one fabrication process using the fabrication apparatus operating on one batch, the batch including a plurality of lots, each lot of the plurality of lots including a workpiece;

receiving a latest array of quantities, each quantity derived from a measurement of a property for a measured workpiece of each lot of the plurality of lots of the latest batch;

calculating automatically an automatic setting group including an automatic corrected setting based on the latest array of quantities and the latest process record;

determining whether the automatic corrected setting is within a specification setting range;

determining whether a next batch signal has been input, indicating the layer deposition process may proceed on a next batch, when the automatic corrected setting is within the specification setting range;

displaying the automatic setting group at an operator interface when the next batch signal has been input;

determining whether a predetermined correction command has been input in response to said displaying the automatic setting group, the command indicating a predetermined corrected setting is to be used instead of the automatic corrected setting; and downloading the automatic corrected setting to the deposition apparatus when the predetermined correction command has not been input, whereby the deposition apparatus performs the fabrication process on the next batch using the automatic corrected setting.

* * * * *